(12) United States Patent
Choe et al.

(10) Patent No.: US 7,745,013 B2
(45) Date of Patent: Jun. 29, 2010

(54) SOLDER FOAMS, NANO-POROUS SOLDERS, FOAMED-SOLDER BUMPS IN CHIP PACKAGES, METHODS OF ASSEMBLING SAME, AND SYSTEMS CONTAINING SAME

(75) Inventors: Heeman Choe, The Woodlands, TX (US); Daewoong Suh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 852 days.

(21) Appl. No.: 11/323,218

(22) Filed: Dec. 30, 2005

(65) Prior Publication Data
US 2007/0152016 A1 Jul. 5, 2007

(51) Int. Cl.
B32B 5/18 (2006.01)
B23K 35/02 (2006.01)
B23K 35/14 (2006.01)
B23K 35/22 (2006.01)
H05K 3/34 (2006.01)

(52) U.S. Cl. ................ 428/613; 428/570; 428/929; 257/772; 228/56.3

(58) Field of Classification Search ............... None
See application file for complete search history.

(56) References Cited

U.S. PATENT DOCUMENTS 3,204,158 A * 8/1965 Schering et al. ............. 257/748
5,972,521 A * 10/1999 Huskamp et al. ............ 428/547

FOREIGN PATENT DOCUMENTS

| JP | 01-316993 | 12/1989 |
| JP | 05-096396 | 4/1993 |
| WO | WO-9307978 A1 | 4/1993 |
| WO | WO-9712718 A1 | 4/1997 |
| WO | WO-2005120765 A1 | 12/2005 |

OTHER PUBLICATIONS

Yuan, B. et al., Microstructure and Martensitic Transformation Behavior of Porous NiTi Shape Memory Alloy Prepared by Hot Isostatic Pressing Processing, Jul. 31, 2004, Materials Science and Engineering A, vol. 382, pp. 181-187.*
International written opinion for PCT/US2006/0474337.*
Office Action Received for Taiwanese Patent Application No. 95146439, mailed Jan. 13, 2009, 12 pgs. (Office Action & English Translation).
International Search Report/Written Opinion for Patent Application No. PCT/US2006/047334, mailed Nov. 15, 2007, 15 Pages.
Office Action Received for Taiwan Patent Application No. 95146349, mailed on Aug. 20, 2009, 2 pages of Taiwan Office Action and English Translation 4 pages.

* cited by examiner

Primary Examiner—Jennifer C McNeil
Assistant Examiner—Adam C Krupicka
(74) Attorney, Agent, or Firm—John N. Greaves (57) ABSTRACT

A foamed solder or a nano-porous solder is formed on a substrate of an integrated circuit package. The foamed solder exhibits a low modulus that resists cracking during shock and dynamic loading. The foamed solder is used as a solder bump for communication between an integrated circuit device and external structures.

16 Claims, 11 Drawing Sheets

SOLDER FOAMS, NANO-POROUS SOLDERS, FOAMED-SOLDER BUMPS IN CHIP PACKAGES, METHODS OF ASSEMBLING SAME, AND SYSTEMS CONTAINING SAME

TECHNICAL FIELD

Embodiments relate generally to integrated circuit fabrication. More particularly, embodiments relate to solder materials and morphologies in connection with microelectronic devices.

TECHNICAL BACKGROUND

Solders are an important part of a packaged integrated circuit (IC). An IC die is often fabricated into a microelectronic device such as a processor. The solders complete couplings between the IC die and the outside world.

The increasing demands upon an IC to perform at high speeds and to not overheat presents problems for the solders. The increasing heat stresses in an IC package causes thermal stresses between the solders and the substrates to which the solder are bonded.

BRIEF DESCRIPTION OF THE DRAWINGS

In order to depict the manner in which the embodiments are obtained, a more particular description of embodiments briefly described above will be rendered by reference to specific embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a foamed solder that is disposed upon an IC substrate. Embodiments also relate to foamed solder metallurgies that are useful to form closed-cell and reticulated solders.

The following description includes terms, such as upper, lower, first, second, etc. that are used for descriptive purposes only and are not to be construed as limiting. The embodiments of an apparatus or article described herein can be manufactured, used, or shipped in a number of positions and orientations.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show only the structures necessary to understand the illustrated embodiments. Additional structures known in the art have not been included to maintain the clarity of the drawings.

Figure 1:
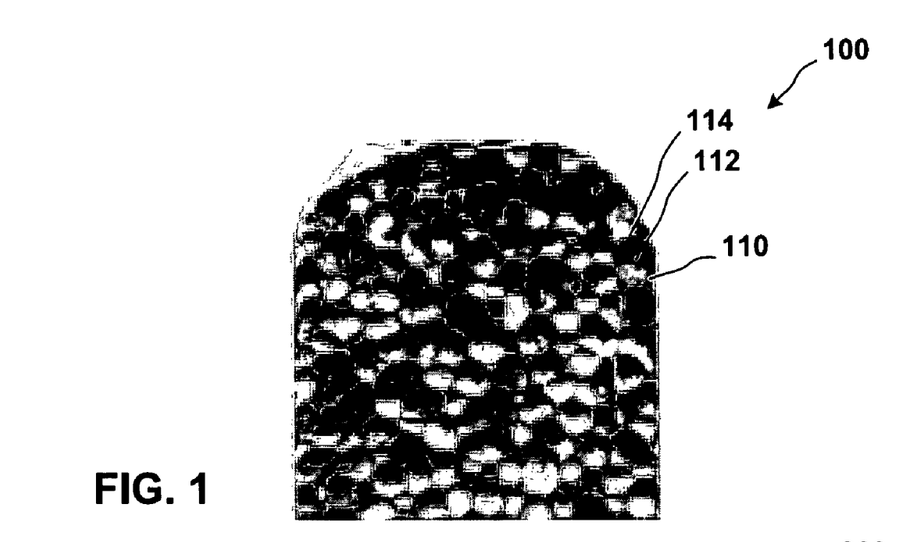
FIG. 1 is a computer-image depiction of a photomicrograph that exhibits a foamed solder in a cellular-foamed morphology according to an embodiment.

FIG. 1 is a computer-image depiction of a photomicrograph 100 that exhibits a foamed solder in a cellular-foamed morphology according to an embodiment. The photomicrograph depiction 100 includes a foamed solder bump 110. The cellular-foamed morphology is depicted by a cellular chamber 112 and a cellular wall 114. Accordingly, the cellular-foamed solder is substantially closed as to the fluid-permeable porosity in the foamed solder bump 110.

Figure 2:
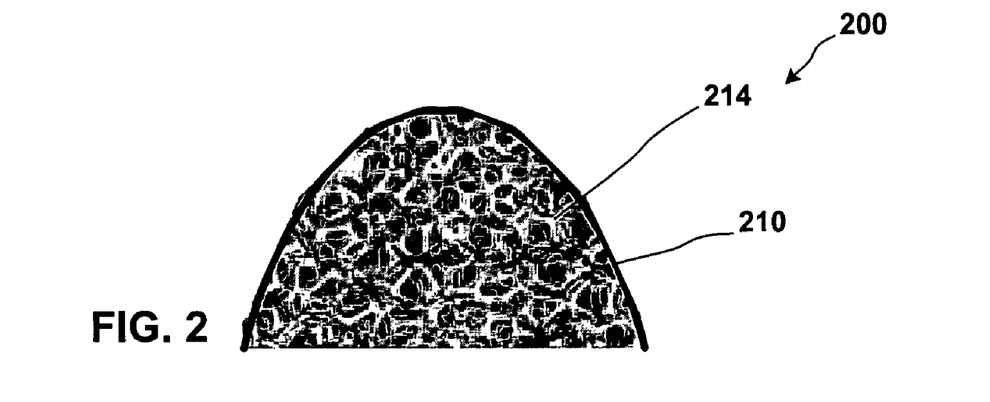
FIG. 2 is a computer-image depiction of a photomicrograph that exhibits a foamed solder in a reticulated-foamed morphology according to an embodiment.

FIG. 2 is a computer-image depiction of a photomicrograph 200 that exhibits a foamed solder in a reticulated-foamed morphology according to an embodiment. The photomicrograph depiction 200 includes a foamed solder bump 210. The reticulated-foamed morphology is depicted by a ganglia 214 of solder that is substantially open as to the fluid-permeable porosity in the foamed solder bump 210.

Hereinafter, the foamed solder, whether it is a cellular-foamed morphology or a reticulated-foamed morphology, will be referred to a simply as "foamed solder". The various embodiments of a cellular-foamed morphology or a reticulated-foamed morphology are applicable to all depictions in this disclosure unless explicitly declared otherwise.

In an embodiment, the foamed solder is a foamed solder of a first material, and the relative density of the foamed solder is in a range from about 0.1 to about 0.9. By "relative density", it is meant that the density of the foamed solder is compared to a solid solder of the same material. A solid solder of the same material can be ascertained by review of the classical-physics densities of materials like pure metals and solders such as can be found in reference materials.

In an embodiment, the foamed solder of a first material has a relative density of about 0.5. In an embodiment, the foamed solder of a first material has a relative density of about 0.6. In an embodiment, the foamed solder of a first material has a relative density of about 0.7. In an embodiment, the foamed solder of a first material has a relative density of about 0.8.

One way to resist shock in an IC package is to improve the Young's modulus (m) of the solder in the solder bump. Under shock loading conditions that are carried out in IC package testing, strain rates can be on the order of about $10^2$/sec for both dynamic and impact loadings. In an embodiment under this strain rate, foamed solder embodiments exhibit so-called strain-rate sensitivity. In other words, foamed solder embodiments become stronger with increasing strain rate. The strain rate sensitivity becomes significant at a high homologous temperature at which the embodied foamed-solder materials are subject to during operation. For example, with m of about 0.2, the strain rate of $10^2$/sec increases yield strength to about 250 percent of quasi-static yield strength. Because of this discovery, under shock-loading conditions, plastic deformation is suppressed and stress-strain behavior of foamed solders diverges positively from classical stress-strain behavior of metals in quasi-static yield strength.

In an embodiment, the foamed solder is a copper-based solder such as pure copper, copper-tin, copper-tin-lead, copper-tin-silver, copper-tin-bismuth, copper-tin-indium and others. In an embodiment, the foamed solder is a nickel-based solder such as pure nickel, nickel-tin, nickel-tin-lead, nickel-tin-silver, nickel-tin-bismuth, nickel-tin-indium and others. In an embodiment, the foamed solder is a nickel-titanium shape-memory alloy such as NITINOL®, manufactured by Johnson-Matthey of Wayne, Pa. NITINOL® is a nickel-titanium alloy that exhibits superplastic behavior. In an embodiment, the foamed solder is a tin-based solder such as pure tin, tin-nickel, tin-lead, tin-indium, tin-lead-nickel, tin-nickel-silver, and others. In an embodiment, the foamed solder is an indium-based solder such as pure indium, indium-tin, indium-lead, indium-lead-nickel, indium-nickel-silver, and others. Other foamed solders can be used depending upon the application.

Figure 3:
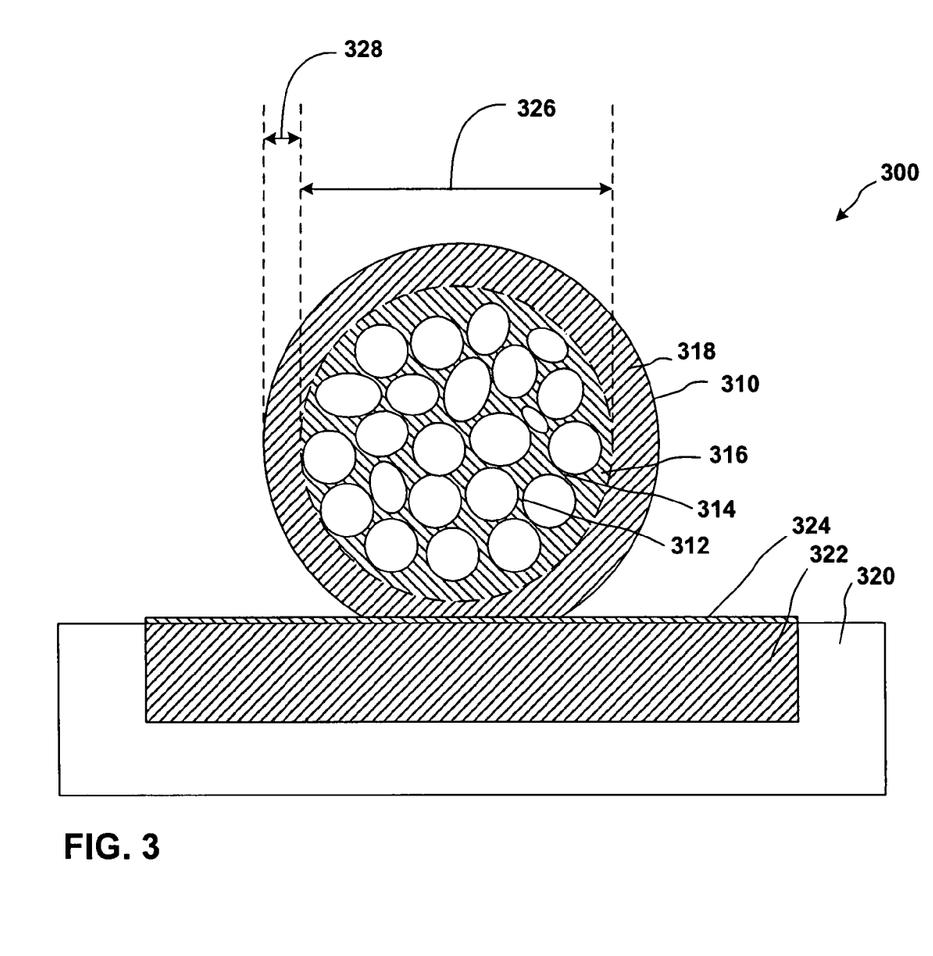
FIG. 3 is an elevational cross-section of an article that includes a foamed solder core and a solder shell upon a substrate according to an embodiment.

FIG. 3 is an elevational cross-section of an article 300 that includes a foamed solder core 316 of a first material and a solder shell 318 of a second material upon a substrate 320 according to an embodiment. In an embodiment, the substrate 320 is an IC die. In an embodiment, the substrate 320 is a mounting substrate such as a printed-wiring board. The foamed solder core 316 is depicted schematically, and it can be either of a cellular-foamed solder or a reticulated-foamed solder according to an embodiment. As depicted, the foamed solder includes a cellular chamber 312 and a cellular wall 314 such as the cellular-foamed solder bump 110 depicted in FIG. 1.

The foamed solder core 316 and the solder shell 318 make up a solder bump 310 according to an embodiment. The substrate 320 includes a bond pad 322 according to an embodiment. In an embodiment, the bond pad 322 exhibits elongated columnar grain morphology that is characteristic of a plating process. The bond pad 322 includes a flash layer 324 such as a gold flash layer 324 upon a copper bond pad 322 according to an embodiment. In an embodiment, the solder bump 310 exhibits a modulus in a range between about 0.2 and about 0.7.

In an embodiment, the solder shell 318 is an intermetallic derivative of the foamed solder core 316. The intermetallic derivative can be any composition that intermingles with the foamed solder core 316 under processing conditions such as reflow, to form an intermetallic material. In an example embodiment, the solder shell 318 is a nickel-tin intermetallic and the foamed solder core is nickel or a nickel alloy.

In an embodiment, the foamed solder core 316 has a diameter 326 of unity, and the thickness 328 of the solder shell 318 has a thickness that is in a range from about 1 percent of unity to about 100 percent of unity. In an embodiment, the solder shell 318 has a thickness that is in a range from about 5 percent of unity to about 20 percent of unity. In an embodiment, the solder shell 318 has a thickness that is in a range from about 6 percent of unity to about 19 percent of unity.

In an embodiment, the size of the solder bump 310, and therefore the approximate dimensions of the foamed solder core 316 and the solder shell 318 can be ascertained by the size of the bond pad 322. In an embodiment, the bond pad 322 is about 106 micrometers (μm). In an embodiment, the diameter 326 of the solder core 316 and twice the thickness 328 of the solder shell 318 also is about 106 μm. Other dimensions can be selected depending upon the application.

Figure 4:
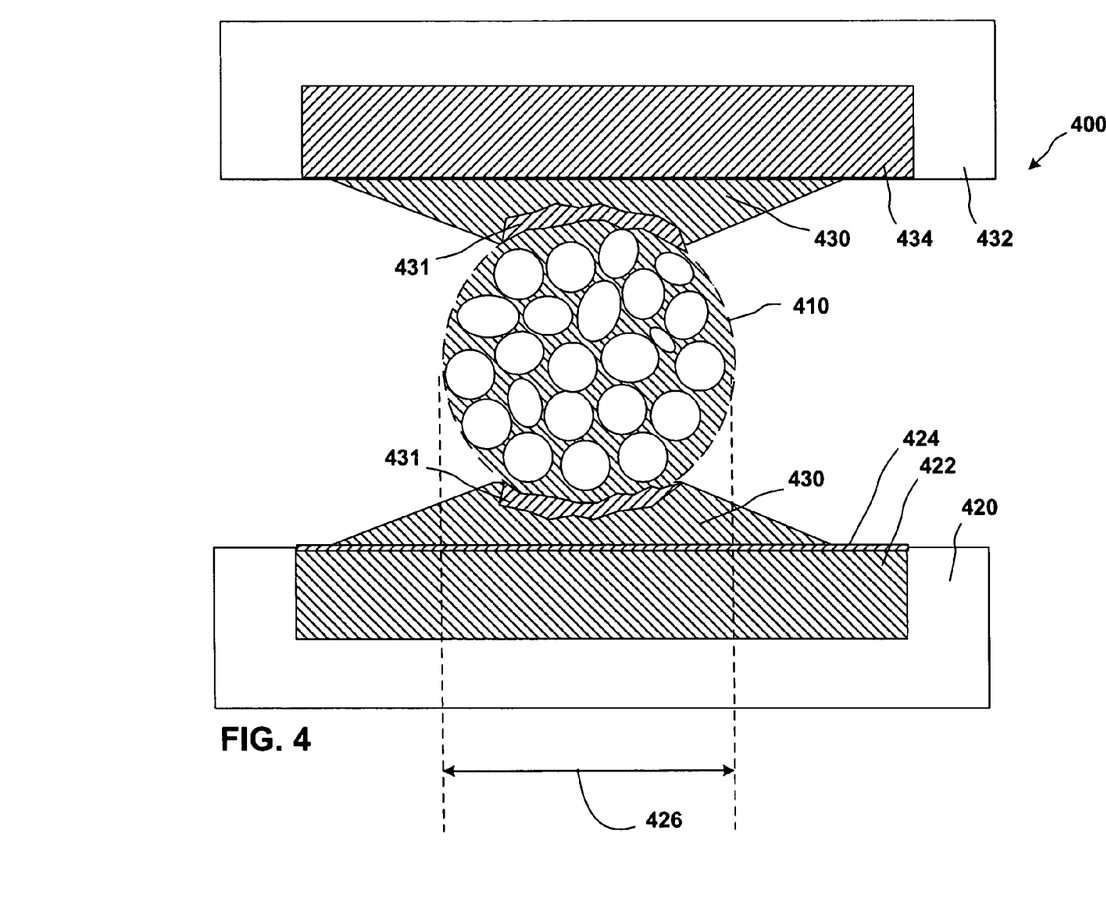
FIG. 4 is an elevational cross-section of an article that includes a foamed solder sphere and an intermediate solder layer upon a substrate according to an embodiment.

FIG. 4 is an elevational cross-section of an article 400 that includes a foamed solder sphere 410 and an intermediate solder layer 430 upon a substrate 420 according to an embodiment. In an embodiment, the substrate 420 is an IC die. In an embodiment, the substrate 420 is a mounting substrate such as a printed-wiring board. The foamed solder sphere 410 is depicted schematically, and it can be either of a cellular-foamed solder or a reticulated-foamed solder according to an embodiment. The substrate 420 includes a bond pad 422 according to an embodiment. In an embodiment, the bond pad 422 exhibits elongated columnar grain morphology that is characteristic of a plating process. The bond pad 422 includes a flash layer 424 such as a gold flash layer 424 upon a copper bond pad 422 according to an embodiment. Above the foamed solder sphere 410 is located an upper substrate 432 and a bond pad 434 according to an embodiment. In an embodiment, the upper substrate 432 is an IC die. In an embodiment, the upper substrate 432 is a mounting substrate such as a printed wiring board. In an embodiment, the solder sphere 410 exhibits a modulus in a range between about 0.2 and about 0.7.

In an embodiment, the intermediate solder layer 430 is a reflowed solder that is denser than the foamed solder sphere 410. In an embodiment, reflowing of the intermediate solder layer 430 is carried out at a temperature that is below the liquidus temperature of the foamed solder sphere 410. For example, the intermediate solder layer 430 begins as nanoparticulates of copper in a paste matrix, and the foamed solder sphere 410 is a prepared sphere with a melting temperature that is at or near the classical-physics melting temperature of elemental copper. During reflow of the intermediate solder layer 430, the average grain size of the copper is no greater than about 20 μm according to an embodiment.

In an embodiment, the foamed solder sphere 410 has a diameter 426 in a range from about 25 μm to about 200 μm. In an embodiment, the foamed solder sphere 410 has a diameter 426 of about 106 μm. In an embodiment, the size of the foamed solder sphere 410 can be ascertained by the size of the bond pad 422. In an embodiment, the bond pad 422 is about 106 μm. Other dimensions can be selected depending upon the application.

In an embodiment, the intermediate solder layer 430 is formed upon the substrate 420 by using a nano-particulate solder paste matrix. In an embodiment, the nano-particulate solder paste includes metal particles, about 100 percent of which pass the 20 nanometer (nm) screening, and the matrix includes a paste such as a fluxing agent and a volatile component.

In an embodiment, the intermediate solder layer 430 includes the nano-particulate solder paste including copper particles, and the foamed solder sphere includes copper. Also, the bond pad 422 includes copper and the flash layer 424 is not present. In an embodiment, the intermediate solder layer 430 includes the nano-particulate solder paste including nickel particles, and the foamed solder sphere includes nickel. Also, the bond pad 422 includes nickel and the flash layer 424 is not present. In an embodiment, the intermediate solder layer 430 includes the nano-particulate solder paste of a shape-memory alloy such as nickel-titanium alloy particles, and the foamed solder sphere also includes the shape-memory alloy. Also, the bond pad 422 includes the shape-memory alloy and the flash layer 424 is not present. In an embodiment, the intermediate solder layer 430 includes the nano-particulate solder paste including metal particles of a first type, and the foamed solder sphere includes the same metal of the same first type. Also, the bond pad 422 includes the same metal of the same first type and the flash layer 424 is not present.

Processing of the intermediate solder layer 430 includes heating the nano-particulate containing solder paste to a low temperature at which the solder particles begin to reflow. Because the solder paste matrix substantially protects the nano-particulates in the intermediate solder layer 430 from corrosive and/or oxidative influences, the intermediate solder layer 430 can resist substantial grain growth during reflow. In an embodiment, the intermediate solder layer 430 after reflow has an average grain size in a range from about 50 nm to about 20 μm.

In an embodiment, the intermediate solder layer 430 before reflow includes a particle having a size in a range from about 2 nm to 50 nm. In an embodiment, the intermediate solder layer 430 includes a particle having a size in a range from about 10 nm to about 30 nm. In an embodiment, the intermediate solder layer 430 includes a particle having a size in a range of about 98% less than or equal to about 20 nm.

Because of the particle size embodiments, nucleation of the metal particles of the intermediate solder layer 430 causes a transition from solid to solidus, and the transition can be initiated at about 400° C. or lower. For example, gold can experience a solid-to-solidus transition at about 300° C.

In an embodiment, the intermediate solder layer 430 includes a melting temperature equal to or below about 400° C. Depending upon the metal type and the particle size, the intermediate solder layer 430 can have a change in melting temperature of several hundred degrees. For example, solid gold has a classical-physics melting temperature of about 1064° C. When gold is formed into a nano-particulate intermediate solder layer 430 as set forth herein, the melting temperature can be reduced to about 300° C. This solid-to-solidus temperature lowering is useful for all the nano-particulate solder composition embodiments set forth in this disclosure.

Where the intermediate solder layer 430 and the foamed solder sphere 410 are of different metals or different alloys, an intermetallic region 431 can form therebetween. In an embodiment, the intermediate solder layer 430 is a copper-tin-indium solder and the foamed solder sphere 410 is copper metal. The intermetallic region 431 in this embodiment is a copper-tin intermetallic material.

Figure 5:
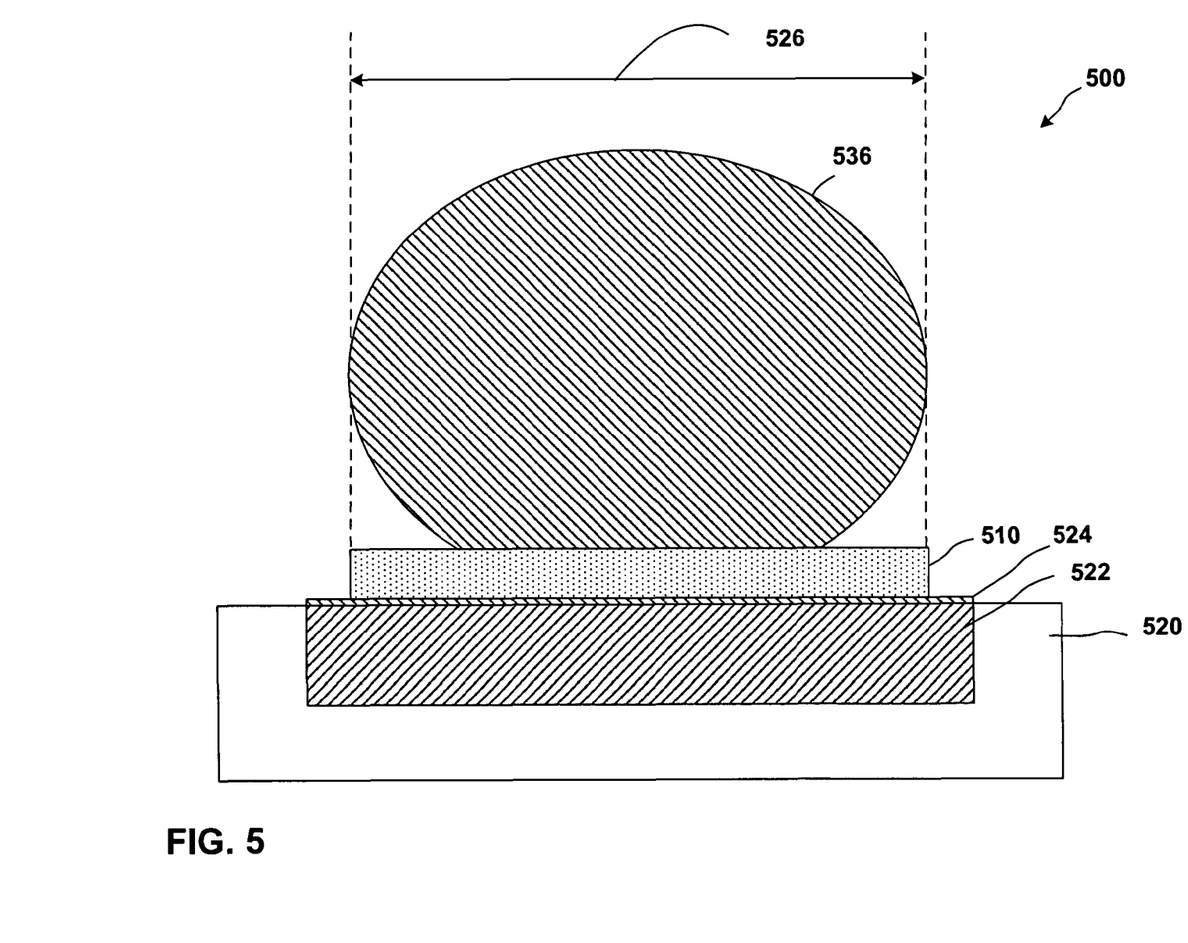
FIG. 5 is an elevational cross-section of an article that includes a foamed-solder elongate pad upon a substrate according to an embodiment.

FIG. 5 is an elevational cross-section of an article 500 that includes a foamed-solder elongate pad 510 upon a substrate 520 according to an embodiment. The foamed-solder elongate pad 510 is depicted schematically, and it can be either of a cellular-foamed solder or a reticulated-foamed solder according to an embodiment. The substrate 520 includes a bond pad 522 according to an embodiment. In an embodiment, the bond pad 522 exhibits elongated columnar grain morphology that is characteristic of a plating process. The bond pad 522 includes a flash layer 524 such as a gold flash layer 524 upon a copper bond pad 522 according to an embodiment. In an embodiment, the foamed-solder elongate pad 510 exhibits a modulus in a range between about 0.2 and about 0.7.

In an embodiment, the foamed-solder elongate pad 510 is prepared with an intermediate solder layer 536 that can be the same material of any intermediate solder layer 436 depicted and described in FIG. 4. Further according to an embodiment, the nano-particulate metal of the intermediate solder layer 536 can be processed to reflow at a temperature that is significantly lower than the classical-physics solidus temperature of the metal.

In an embodiment, the foamed-solder elongate pad 510 has a characteristic dimension 526 in a range from about 25 μm to about 200 μm. In an embodiment, the foamed-solder elongate pad 510 has a characteristic dimension 526 of about 106 μm. In an embodiment, the size of the foamed-solder elongate pad 510 can be ascertained by the size of the bond pad 522. In an embodiment, the bond pad 522 is about 106 μm. Other dimensions can be selected depending upon the application.

In an embodiment, the intermediate solder layer 536 is formed upon the substrate 520 by using a nano-particulate solder paste matrix. In an embodiment, the nano-particulate solder paste includes metal particles, about 100 percent of which pass the 20 nm screening, and the matrix includes a paste such as a fluxing agent and a volatile component.

In an embodiment, the intermediate solder layer 536 includes the nano-particulate solder paste including copper particles, and the foamed-solder elongate pad 510 includes copper. Also, the bond pad 522 includes copper and the flash layer 524 is not present. In an embodiment, the intermediate solder layer 536 includes the nano-particulate solder paste including nickel particles, and the foamed-solder elongate pad 510 includes nickel. Also, the bond pad 522 includes nickel and the flash layer 524 is not present. In an embodiment, the intermediate solder layer 536 includes the nano-particulate solder paste of a shape-memory alloy such as nickel-titanium alloy particles, and the foamed-solder elongate pad 510 also includes the shape-memory alloy. In an embodiment, the intermediate solder layer 536 includes the nano-particulate solder paste including metal particles of a first type, and the foamed-solder elongate pad 510 includes the same metal of the same first type. Also, the bond pad 522 includes the same metal of the same first type and the flash layer 524 is not present.

Processing of the intermediate solder layer 536 includes heating the nano-particulate containing solder paste to a low temperature at which the solder particles begin to reflow. Because the solder paste matrix substantially protects the nano-particulates in the intermediate solder layer 536 from corrosive and/or oxidative influences, the intermediate solder layer 536 can resist substantial grain growth during reflow. In an embodiment, the intermediate solder layer 536 after reflow has an average grain size in a range from about 50 nm to less than or equal to about 20 μm.

In an embodiment, the intermediate solder layer 536 before reflow includes a particle having a size in a range from about 2 nm to 50 nm. In an embodiment, the intermediate solder layer 536 includes a particle having a size in a range from about 10 nm to about 30 nm. In an embodiment, the intermediate solder layer 536 includes a particle having a size in a range of about 98% less than or equal to about 20 nm.

Figure 6:
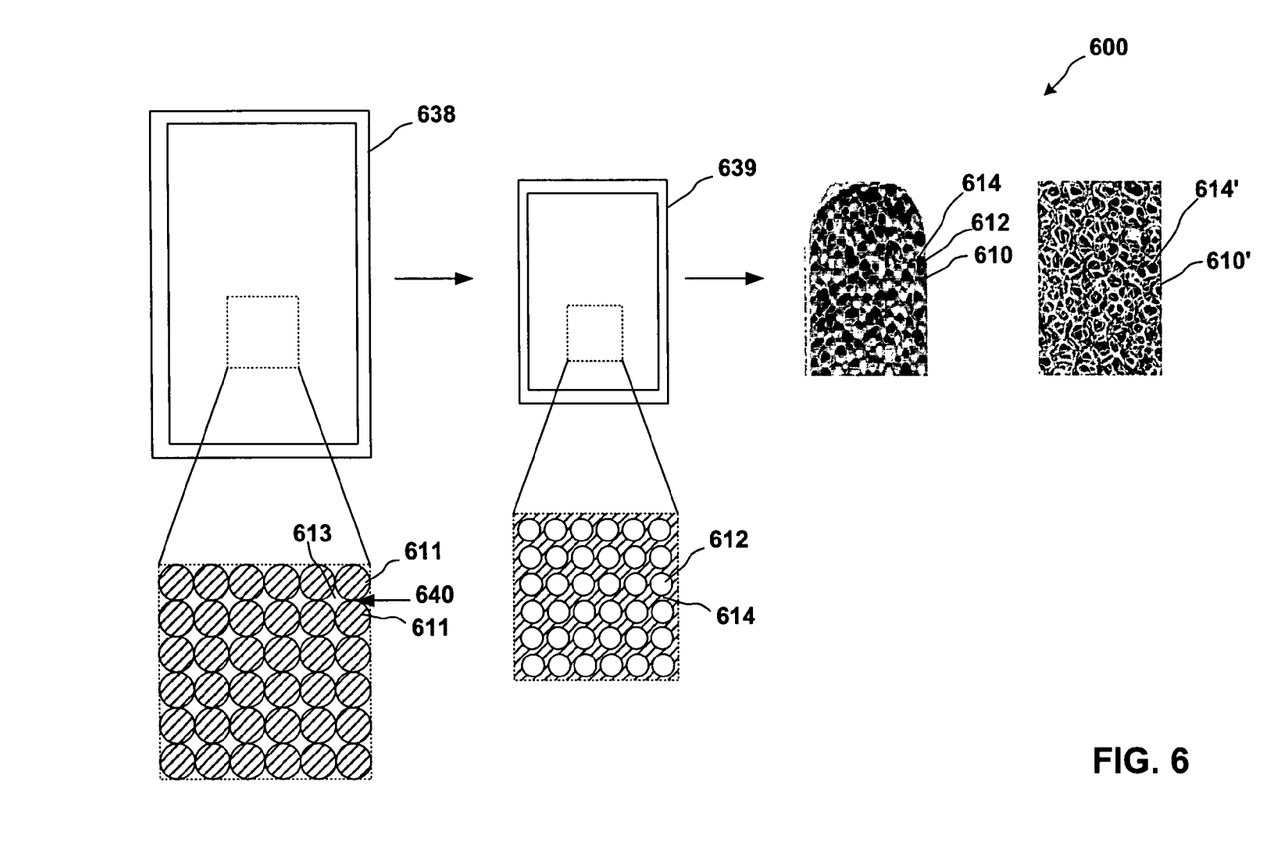
FIG. 6 is a process depiction of forming a foamed solder according to an embodiment.

FIG. 6 is a process depiction 600 of forming a foamed solder according to an embodiment. Processing begins by first intermingling a foamed solder precursor 611 with a compressible gas 613. In an embodiment, the foamed solder precursor 611 is a metal particulate. In an embodiment, the compressible gas 613 is inert to the metal of the foamed solder precursor. In an embodiment, the compressible gas 613 is argon.

In an embodiment, the foamed solder precursor 611 includes a metallic surfactant that facilitates the formation of the foamed solder. In an embodiment, the foamed solder 611 composition includes, by weight percent, approximately Sn-10In-0.6Cu. In this depiction, the foamed solder precursor 611 composition includes about 10 percent indium, about 0.6 percent copper, and the balance tin. Other impurities may be present, based upon the specific feedstocks obtained and the chemical purities thereof.

In FIG. 6, the foamed solder precursor 611 is placed into a can 638 as is known in the metal-consolidation art. The filled can 638 is then processed by compressing to achieve a high-pressure can 639 that contains the foamed solder precursor 611 and the compressible gas 613. In an embodiment, the high-pressure can 639 is achieved by hot-isostatic pressing (HIPing) as is known in the metal-consolidation art. After HIPing, the high-pressure can 639 is further heated without significantly restrictive external pressure, and the high-pressure can 639 expands such that a metal foam 610 is formed that includes a metal chamber 612 and a metal wall 614 if the foamed solder is a cellular-foamed solder. Alternatively after HIPing, the high-pressure can 639 is further heated without significantly restrictive external pressure, and the high-pressure can 639 expands such that a metal foam 610' is formed that includes a metal ganglia 614' that is formed if the foamed solder is a reticulated-foamed solder.

In an embodiment, the filled can 638 is not HIPed, but rather it is first heated to cause sintering of the foamed solder precursor 611 as is understood in the metal-consolidation art. Sintering does not cause a complete reflow of the foamed solder precursor, rather, a nucleation of contact points 640 between two occurrences of the foamed solder precursor 611. Second heating of the foamed solder precursor 611 forms a metal foam such that first sintering and second heating expansion of the foamed solder occurs. In an embodiment, the first sintering achieves a foamed solder such that a metal foam 610 is a cellular-foamed solder. Alternatively, the first heating achieves a foamed solder such that a metal foam 610' with a metal ganglia 614' is formed.

In an embodiment, the filled can 638 is first consolidated without significant external heating, and second heated to cause the solder precursor 611 to expand. In an embodiment, the second heating achieves a foamed solder such that a metal foam 610 is a cellular-foamed solder. Alternatively, the second heating achieves a foamed solder such that a metal foam 610' with a metal ganglia 614' is formed.

Other techniques are usable to form the foamed solder. In an embodiment, investment casting is used as is known in the art. In an embodiment, melt processing is used along with the decomposition of metal hydride, which forms a gas that creates the porosity in the foamed solder. In an embodiment, powder processing is used that exploits the decomposition of the metal hydride. In an embodiment, a polymer prefoam is used as a temporary support structure to support the foamed solder as it solidifies, after which the polymer prefoam is driven off.

In an embodiment, metal powder is packed into a can, which is outgassed and then pressurized with argon gas. The can is HIPed to consolidate the metal powder. After consolidation, the can is heated to expand the entrapped gas by creep of the surrounding matrix in the HIPed powder. This technique is available to produce porous metals with bulk densities in a range from about 0.6 to about 0.8. The size and distribution of pores may be precisely controlled using appropriate gas pressure, metal surfactant content, heating time, temperature, and other parameters.

In an embodiment after forming of the metal foam 610 or the metal foam 610', the metal foam (hereinafter "metal foam 610") is further processed to prepare a solder bump. In an embodiment, the metal foam 610 is first extruded without destroying the foamed quality, and it is cut as wire into short sections by a heading machine until the wire is substantially cubical or solid cylindrical. Processing of the substantially cubical or solid cylindrical pieces of foamed solder includes tumbling to achieve a more spherical shape, or grinding in a mill. In an embodiment, autogenous grinding of the substantially cubical or solid cylindrical foamed solder is done in a tumbling mill. In an embodiment, semi-autogenous grinding of the substantially cubical or solid cylindrical foamed solder is done in a tumbling mill with the presence of a first amount of grinding media such as ceramic balls. In an embodiment, mill-grinding of the substantially cubical or solid cylindrical foamed solder is done in a tumbling mill with a second amount of grinding media that is greater than the first amount of grinding media. In an embodiment after first grinding the foamed solder to achieve a spherical shape, surface finishing is carried out in a less extreme tumbling environment.

Once the foamed solder core or the foamed solder sphere is made, the solder is coated on the foamed solder by electroplating according to an embodiment. Reference is again made to FIG. 3. Where the foamed solder core 316 is a shape-memory foam, a nickel plating process is carried out to create enhanced wettability between the shape-memory alloy and the bond pad 322. Where the flash layer 324 is present, the plating process can be eliminated according to an embodiment.

Figure 7:
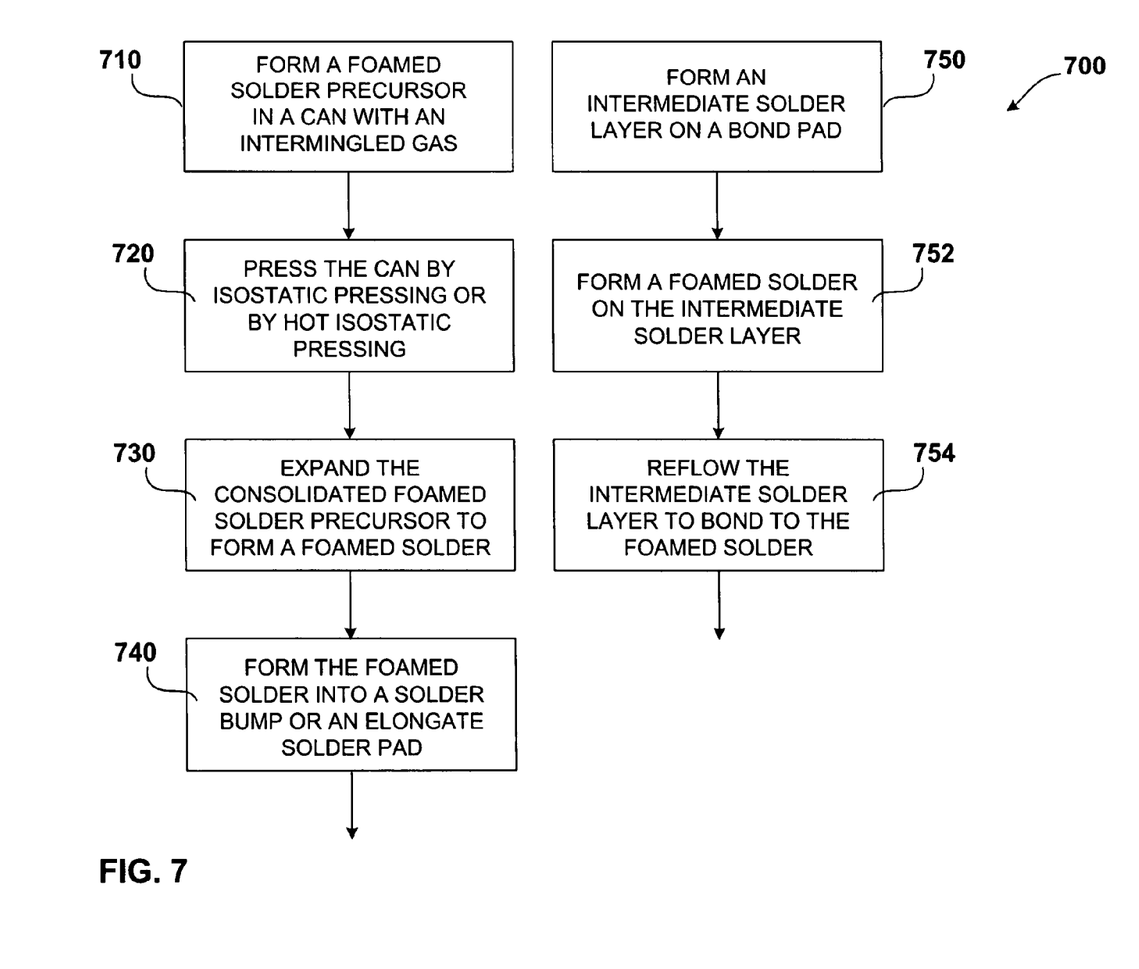
FIG. 7 is a flow chart that describes a process flow according to an embodiment.

FIG. 7 is a flow chart that describes a process flow according to various embodiments.

At 710, the process includes forming a foamed solder precursor in a can along with an intermingled gas.

At 720, the process includes pressing the can. The process can include isostatic pressing or HIPing.

At 730, the process includes heating the can under conditions to cause the foamed solder precursor to form a cellular foam or a reticulated foam. In an embodiment, the process terminates at 720.

At 740, the process includes forming the foamed solder into a foamed solder ball or into a foamed-elongate solder pad.

At 750, a process embodiment includes forming an intermediate solder layer on a bond pad. In an embodiment, the intermediate solder layer is a nano-particulate solder preform.

At 752, the process includes forming a foamed-solder such as a foamed solder bump or a foamed solder elongate pad on the intermediate solder layer.

At 754, the process includes reflowing the intermediate solder layer to bond to the foamed solder. In an embodiment, the process terminates at 754.

Figure 8:
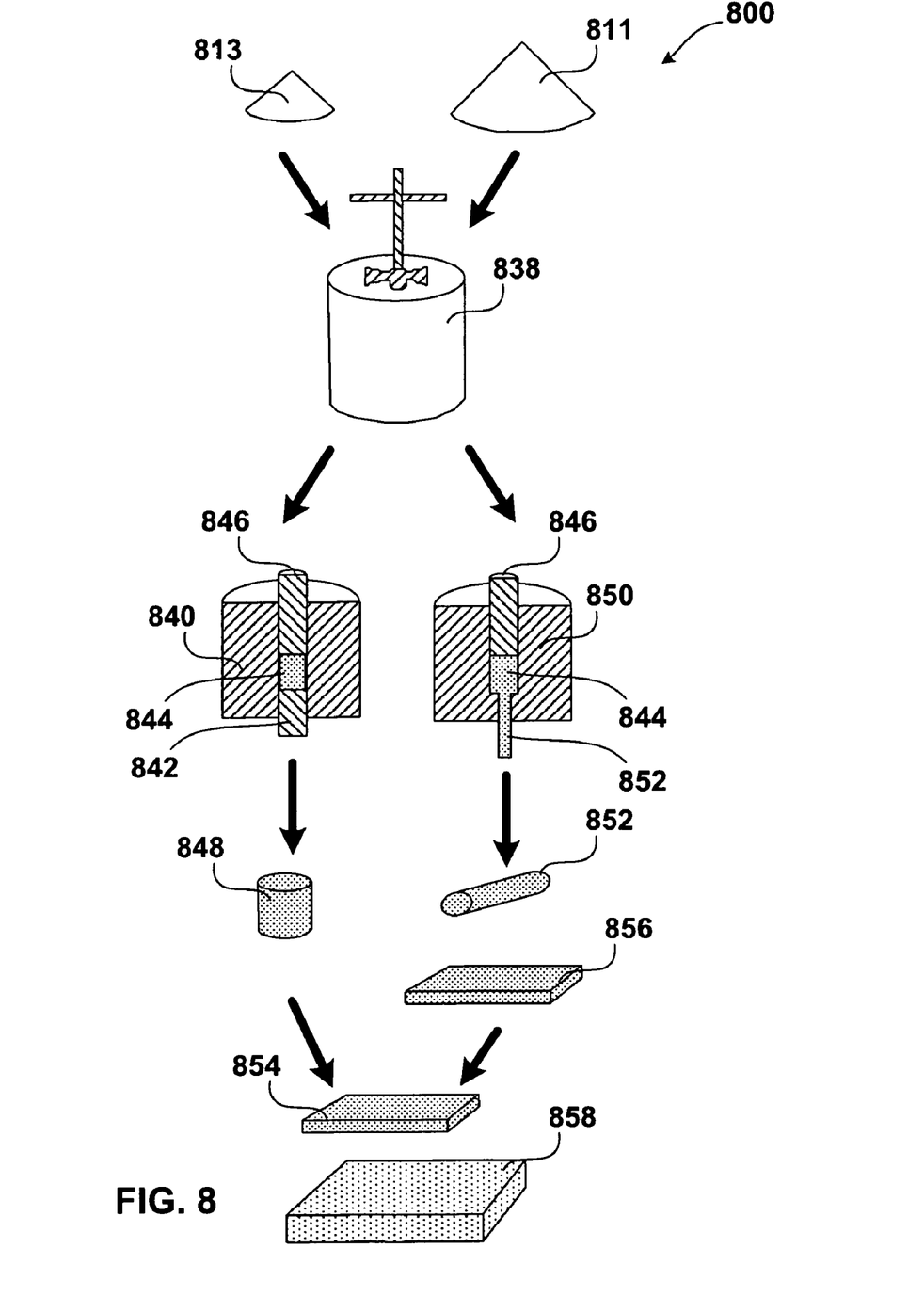
FIG. 8 is a process depiction of forming a nano-porous solder according to an embodiment.

FIG. 8 is a process depiction 800 of forming a nano-porous solder according to an embodiment. Processing begins by first intermingling a foamed solder precursor 811 with a blowing agent 813. In an embodiment, the foamed solder precursor 811 is a metal particulate that has an average particle diameter in a range from about 5 nm to about 50 nm. In an embodiment, the foamed solder precursor 811 is a metal particulate that has an average particle diameter in a range from about 10 nm to about 40 nm. In an embodiment, the foamed solder precursor 811 is a metal particulate that has an average particle diameter in a range from about 15 nm to about 30 nm. In an embodiment, the foamed solder precursor 811 is a metal particulate that has an average particle diameter that is about 99% passing 20 nm and about 98% larger than about 5 nm.

In an embodiment, the blowing agent 813 is a metal hydride such as titanium hydride ($TiH_2$). In an embodiment, the blowing agent 813 is a metal hydride such as zirconium hydride ($ZrH_2$). In an embodiment, the blowing agent 813 is a metal hydride such as hafnium hydride ($HfH_2$). In an embodiment, the blowing agent 813 is a refractory metal hydride, represented as $RH_2$. In an embodiment, the blowing agent 813 substantially matches the particle size distribution of the foamed solder precursor.

In an embodiment, the foamed solder precursor 811 includes a metallic surfactant that facilitates the formation of the foamed solder. In an embodiment, the foamed solder precursor 811 composition includes, by weight percent, approximately Sn-10In-0.6Cu. In this depiction, the foamed solder precursor 811 composition includes about 10 percent indium, about 0.6 percent copper, and the balance tin. Other impurities may be present, based upon the specific feedstocks obtained and the chemical purities thereof.

In FIG. 8, the foamed solder precursor 811 and the blowing agent 813 is placed into a mixing vessel 838, for example, such as is known in the metal-comminution arts. The mixing vessel 838 is then operated by blending the foamed solder precursor 811 and the blowing agent 813 to achieve a precursor-blowing agent mixture.

In an embodiment, the precursor-blowing agent mixture is compressed in an axial-compression die 840. Compression dies are used, for example, in the powder metallurgy consolidation art. An anvil 842 receives a precursor-blowing agent mixture 844 and is pressed into the anvil 842 by a ramrod 846. After axial pressing an axially pressed pellet 848 is the result.

In an embodiment, the precursor-blowing agent mixture is compressed in an extrusion die 850. Extrusion is known, for example, in the powder metallurgy extrusion art. The precursor-blowing agent mixture 844 and is pressed into the extrusion die 850 by a ramrod 846. After extrusion, an extruded pellet 852 is the result.

In an embodiment, either the axially pressed pellet 848 or the extruded pellet 852 is a nano-porous solder precursor that is further processed such as rolling to achieve rolled sheet stock 854 or 856. In an embodiment, the pellet or the rolled sheet stock is stamped from pellet or rolled stock, into substantially spherical pellets of a nano-porous solder precursor for further processing.

Processing of the substantially cubical or solid cylindrical pieces of the nano-porous solder precursor from a pressed or extruded pellet includes tumbling to achieve a more spherical shape, or grinding in a mill. In an embodiment, autogenous grinding of the nano-porous solder precursor is done in a tumbling mill. In an embodiment, semi-autogenous grinding of the nano-porous solder precursor is done in a tumbling mill with the presence of a first amount of grinding media such as ceramic balls. In an embodiment, mill-grinding of the nano-porous solder precursor is done in a tumbling mill with a second amount of grinding media that is greater than the first amount of grinding media. In an embodiment after first grinding the nano-porous solder precursor to achieve a spherical shape, surface finishing is carried out in a less extreme tumbling environment.

After forming the nano-porous solder precursor into a desired shape, the desired shape is further processed under heating to achieve a nano-porous solder 858.

Figure 9A:
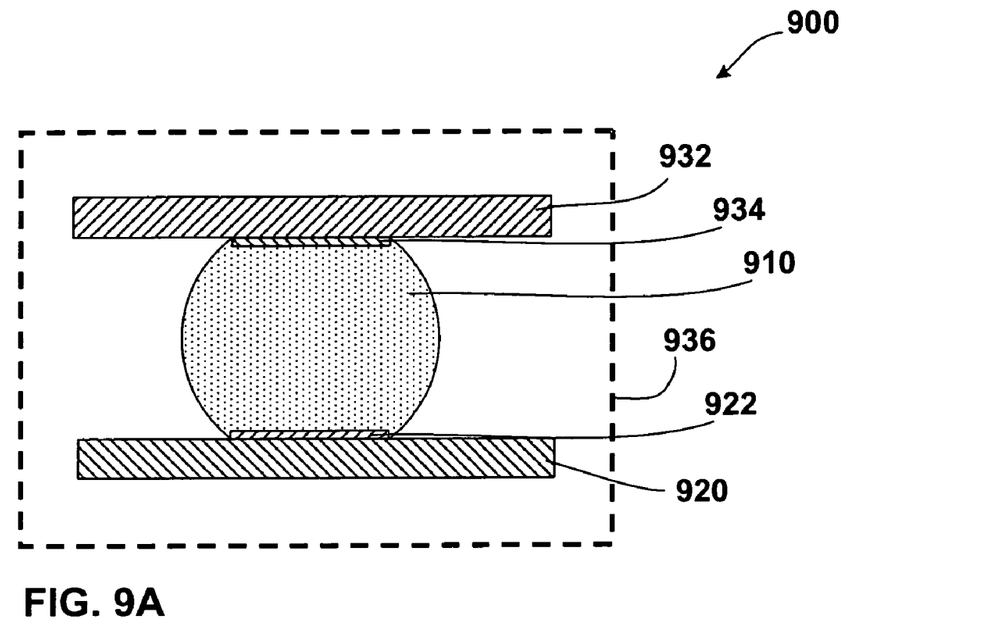
FIG. 9A is an elevational cross-section of an article during processing of a nano-porous solder according to an embodiment.

FIG. 9A is an elevational cross-section of an article 900 during processing of a nano-porous solder according to an embodiment. A pellet 910, such as a nano-porous solder precursor, is disposed on a mounting substrate 920. In an embodiment, the mounting substrate 920 is a board. In an embodiment, the mounting substrate 920 is a die. In an embodiment, the mounting substrate 920 includes a bond pad 922. In an embodiment, an upper substrate 932 includes an upper substrate bond pad 934, and the upper substrate 932 is also in contact with the pellet 910.

Processing of the pellet 910 is reflowed in a thermal environment as illustrated by the dashed line 936 as a hot space such as an oven.

In an embodiment, the pellet 910 includes a nano-particulate foamed solder precursor in any size distribution range set forth in this disclosure. Similarly, a blowing agent is also present, substantially uniformly blended such as to facilitate expansion of the pellet 910 during reflow. In an embodiment, heating of the pellet 910 is carried out in a temperature range from about 150° C. to about 260° C. In an embodiment during reflow, the blowing agent liberates gas, such as hydrogen from a metal hydride. As the nano-porous solder precursor begins to nucleate at solidus reflow, a balance is struck between surface tension on nascent nano-sized gas bubbles and on grain growth from the nano-sized particles of the foamed solder precursor. Consequently, grain sizes that overcome the dimensions of the nascent nano-sized gas bubbles are avoided.

In an embodiment, reflow is carried out under an overpressure such as a HIPing environment, but the temperature is in the range from about 150° C. to about 260° C. In this embodiment, the overpressure is balanced against the nascent pressure of liberated gases, while the other balances of reflowing solder wetting and even the gravitational effect of the nascent nano-sized gas bubbles rising during reflow. In an embodiment, the nascent nano-sized gas bubbles in the reflowing solder is substantially in the Stokes flow regime, which includes creeping flow.

Figure 9B:
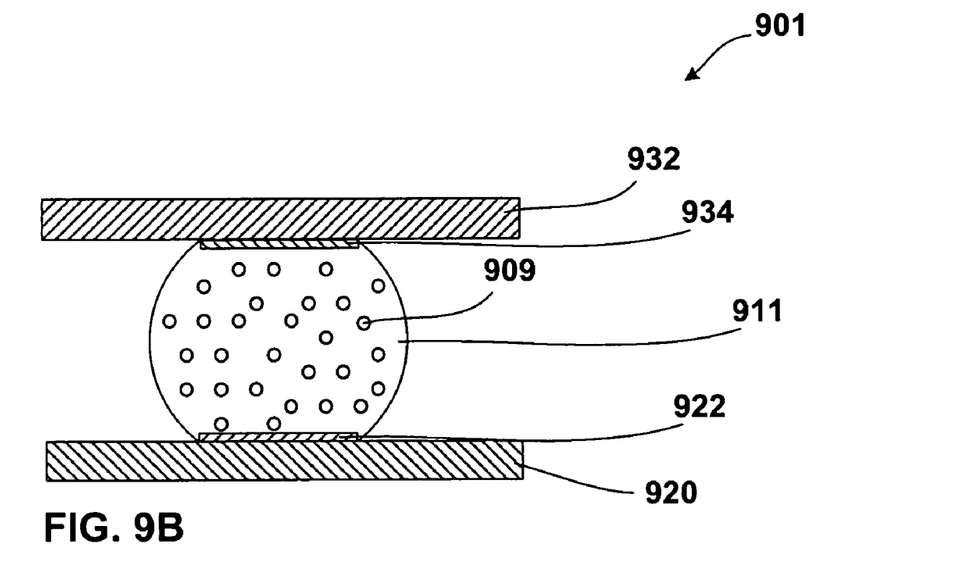
FIG. 9B is an elevational cross-section of the article depicted in FIG. 9A after further processing of the nano-porous solder according to an embodiment.

FIG. 9B is an elevational cross-section of the article depicted in FIG. 9A after further processing of the nano-porous solder according to an embodiment. The article 901 has been processed such that nanopores have formed in the reflowed pellet 911, one of which is designated with the reference numeral 909. In an embodiment, the degree of porosity of the reflowed pellet 911 is in a range from about 1% to about 70%. In an embodiment, the relative density of the reflowed pellet 911 is in a range from about 0.1 to about 0.9. By "relative density", it is meant that the density of the reflowed pellet 911 is compared to a solid solder of the same material. In an embodiment, the reflowed pellet 911 has a relative density of about 0.5. In an embodiment, the foamed solder reflowed pellet 911 has a relative density of about 0.6. In an embodiment, the reflowed pellet 911 has a relative density of about 0.7. In an embodiment, the reflowed pellet 911 has a relative density of about 0.8.

Figure 10:
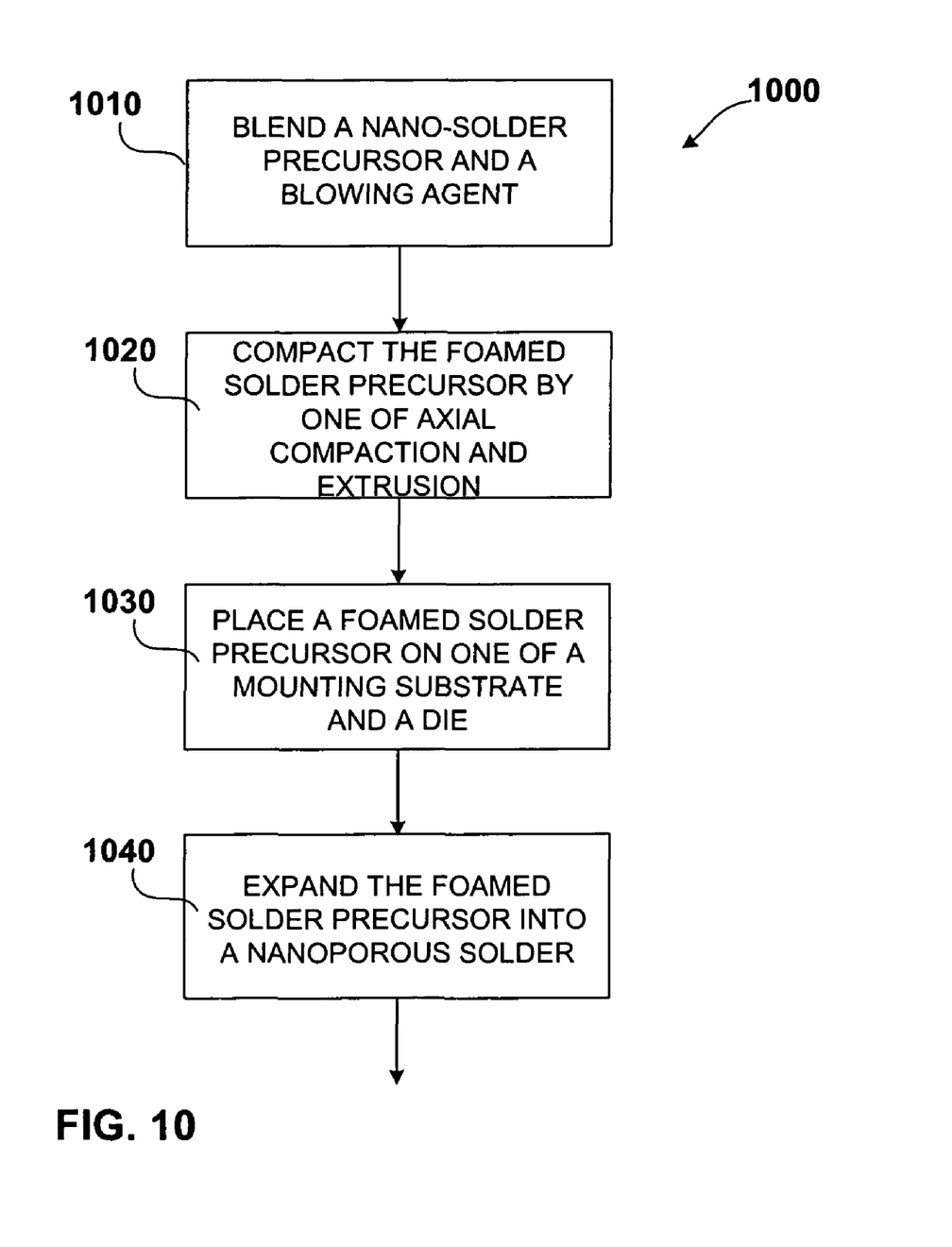
FIG. 10 is a process flow diagram for processing a nano-porous solder precursor according to an embodiment.

FIG. 10 is a process flow diagram 1000 for processing a nano-porous solder precursor according to an embodiment.

At 1010, the process includes blending a nano-solder precursor and a blowing agent.

At 1020, the process includes compacting the nano-solder precursor and the blowing agent into a foamed solder precursor.

At 1030, the process includes placing the nano-solder precursor upon one of a mounting substrate and a die.

At 1040, the process includes expanding the nano-solder precursor to achieve a nano-porous solder.

Figure 11:
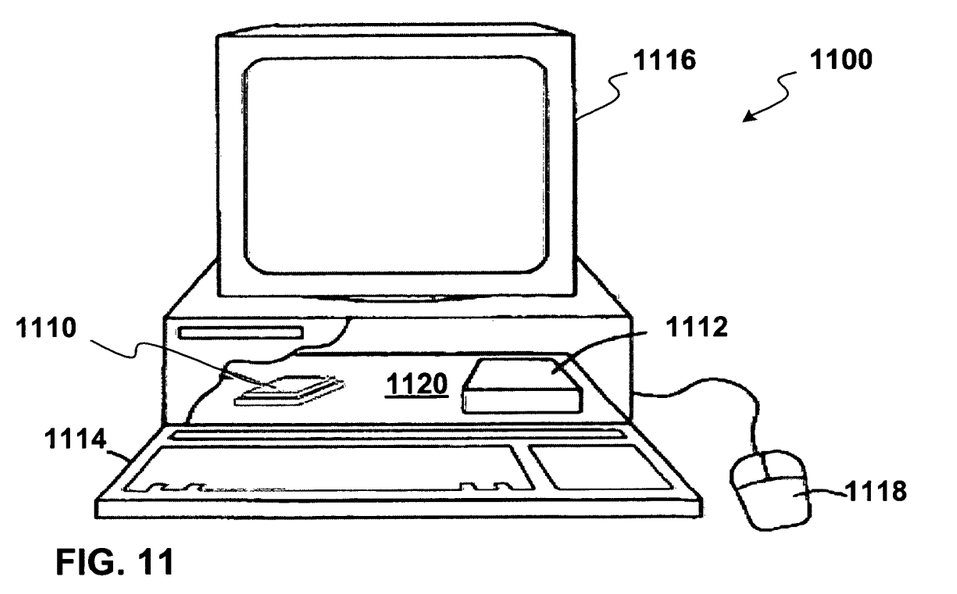
FIG. 11 is a cut-away elevation that depicts a computing system according to an embodiment.

FIG. 11 is a cut-away elevation that depicts a computing system 1100 according to an embodiment. One or more of the foregoing embodiments of the foamed solder bumps, foamed solder elongate pads, or nano-porous solder spheres may be utilized in a computing system, such as a computing system 1100 of FIG. 11. Hereinafter any foamed solder bumps, foamed solder elongate pads, or nano-porous solder spheres embodiments alone or in combination with any other embodiment is referred to as an embodiment(s) configuration.

The computing system 1100 includes at least one processor (not pictured), which is enclosed in a package 1110, a data storage system 1112, at least one input device such as a keyboard 1114, and at least one output device such as a monitor 1116, for example. The computing system 1100 includes a processor that processes data signals, and may include, for example, a microprocessor, available from Intel Corporation. In addition to the keyboard 1114, the computing system 1100 can include another user input device such as a mouse 1118, for example.

For purposes of this disclosure, a computing system 1100 embodying components in accordance with the claimed subject matter may include any system that utilizes a microelectronic device system, which may include, for example, at least one of the foamed solder bumps, foamed solder elongate pads, or nano-porous solder spheres embodiments that is coupled to data storage such as dynamic random access memory (DRAM), polymer memory, flash memory, and phase-change memory. In this embodiment, the embodiment (s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration that is coupled to the processor (not pictured) is part of the system with an embodiment(s) configuration that is coupled to the data storage of the DRAM cache. Additionally in an embodiment, an embodiment(s) configuration is coupled to the data storage 1112.

In an embodiment, the computing system 1100 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP (not pictured) is part of a chipset that may include a stand-alone processor and the DSP as separate parts of the chipset on the board 1120. In this embodiment, an embodiment(s) configuration is coupled to the DSP, and a separate embodiment(s) configuration may be present that is coupled to the processor in the package 1110. Additionally in an embodiment, an embodiment(s) configuration is coupled to a DSP that is mounted on the same board 1120 as the package 1110. It can now be appreciated that the embodiment(s) configuration can be combined as set forth with respect to the computing system 1100, in combination with an embodiment(s) configuration as set forth by the various embodiments of the foamed solder bumps, foamed solder elongate pads, or nano-porous solder spheres within this disclosure and their equivalents.

Figure 12:
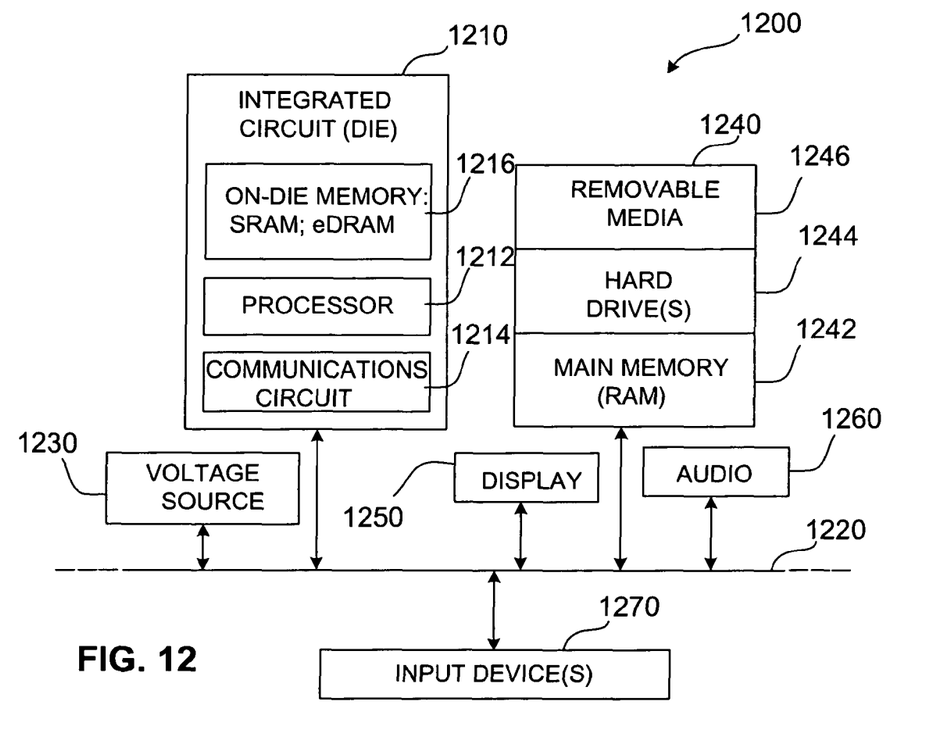
FIG. 12 is a schematic of a computing system according to an embodiment.

FIG. 12 is a schematic of a computing system according to an embodiment. The electronic system 1200 as depicted can embody the computing system 1100 depicted in FIG. 11, but the electronic system is depicted more generically. The electronic system 1200 incorporates at least one electronic assembly 1210, such as an IC package illustrated in FIGS. 3-5. In an embodiment, the electronic system 1200 is a computer system that includes a system bus 1220 to electrically couple the various components of the electronic system 1200. The system bus 1220 is a single bus or any combination of busses according to various embodiments. The electronic system 1200 includes a voltage source 1230 that provides power to the integrated circuit 1210. In some embodiments, the voltage source 1230 supplies current to the integrated circuit 1210 through the system bus 1220.

The integrated circuit 1210 is electrically coupled to the system bus 1220 and includes any circuit, or combination of circuits according to an embodiment. In an embodiment, the integrated circuit 1210 includes a processor 1212 that can be of any type. As used herein, the processor 1212 means any type of circuit such as, but not limited to, a microprocessor, a microcontroller, a graphics processor, a digital signal processor, or another processor. Other types of circuits that can be included in the integrated circuit 1210 are a custom circuit or an ASIC, such as a communications circuit 1214 for use in wireless devices such as cellular telephones, pagers, portable computers, two-way radios, and similar electronic systems. In an embodiment, the processor 1210 includes on-die memory 1216 such as SRAM. In an embodiment, the processor 1210 includes on-die memory 1216 such as eDRAM.

In an embodiment, the electronic system 1200 also includes an external memory 1240 that in turn may include one or more memory elements suitable to the particular application, such as a main memory 1242 in the form of RAM, one or more hard drives 1244, and/or one or more drives that handle removable media 1246 such as diskettes, compact disks (CDs), digital video disks (DVDs), flash memory keys, and other removable media known in the art.

In an embodiment, the electronic system 1200 also includes a display device 1250, an audio output 1260. In an embodiment, the electronic system 1200 includes a controller 1270, such as a keyboard, mouse, trackball, game controller, microphone, voice-recognition device, or any other device that inputs information into the electronic system 1200.

As shown herein, integrated circuit 1210 can be implemented in a number of different embodiments, including an electronic package, an electronic system, a computer system, one or more methods of fabricating an integrated circuit, and one or more methods of fabricating an electronic assembly that includes the integrated circuit and the foamed-solder embodiments as set forth herein in the various embodiments and their art-recognized equivalents. The elements, materials, geometries, dimensions, and sequence of operations can all be varied to suit particular packaging requirements.

It can now be appreciated that foamed-solder embodiments set forth in this disclosure can be applied to devices and apparatuses other than a traditional computer. For example, a die can be packaged with an embodiment(s) configuration, and placed in a portable device such as a wireless communicator or a hand-held device such as a personal data assistant and the like. Another example is a die that can be packaged with an embodiment(s) configuration and placed in a vehicle such as an automobile, a locomotive, a watercraft, an aircraft, or a spacecraft.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An article comprising:
   a foamed solder core of a first material;
   a substrate upon which the foamed solder core is disposed,
   an intermediate solder layer disposed upon the substrate and in contact with the foamed solder core, wherein the intermediate solder layer includes an average grain-size diameter of about 20 micrometers; and
   a bond pad as part of the substrate, wherein the bond pad is in contact with the intermediate solder layer, and wherein the bond pad includes a grain morphology characteristic of elongated columnar.

2. The article of claim 1, further including a solder shell of a second material covering the foamed solder core.

3. The article of claim 1, wherein the foamed solder core is a material selected from cellular-foamed and reticulated-foamed.

4. The article of claim 1, wherein the foamed solder core is a metal selected from copper-based solder, nickel-based solder, tin-based solder, indium-based solder, lead-based solder, and combinations thereof.

5. The article of claim 1, wherein the foamed solder includes a shape-memory alloy.

6. The article of claim 1, wherein the solder shell of a second material includes an intermetallic derivative of the foamed solder core.

7. The article of claim 1,
   wherein the intermediate solder layer is denser than the foamed solder core.

8. The article of claim 1, wherein the foamed solder core is an elongate pad disposed upon the substrate; and
   a bond pad as part of the substrate, wherein the bond pad is in contact with the elongate pad.

9. An article comprising:
   a foamed solder core of a first material;
   a substrate upon which the foamed solder core is disposed, wherein the foamed solder core of a first material includes copper;
   an intermediate solder layer disposed upon the substrate and in contact with the foamed solder core, wherein the intermediate solder layer includes copper; and
   a bond pad as part of the substrate, wherein the bond pad is in contact with the intermediate solder layer, wherein the bond pad includes a grain morphology characteristic of elongated columnar, and wherein the bond pad includes copper.

10. The article of claim 9, further including a solder shell of a second material covering the foamed solder core.

11. The article of claim 9, wherein the foamed solder core is a material selected from cellular-foamed and reticulated-foamed.

12. The article of claim 9, wherein the foamed solder core is a metal selected from copper-based solder, nickel-based solder, tin-based solder, indium-based solder, lead-based solder, and combinations thereof.

13. The article of claim 9, wherein the foamed solder includes a shape-memory alloy.

14. The article of claim 9, wherein the solder shell of a second material includes an intermetallic derivative of the foamed solder core.

15. The article of claim 9, wherein the intermediate solder layer is denser than the foamed solder core.

16. The article of claim 9, wherein the foamed solder core is an elongate pad disposed upon the substrate; and
   a bond pad as part of the substrate, wherein the bond pad is in contact with the elongate pad.

* * * * *